United States Patent [19]
Kendall et al.

[11] 3,969,746
[45] July 13, 1976

[54] VERTICAL MULTIJUNCTION SOLAR CELL

[75] Inventors: Don Leslie Kendall, Richardson; Francois Antoine Padovani, Dallas; Kenneth Elwood Bean; Walter Theodore Matzen, both of Richardson, all of Tex.

[73] Assignee: Texas Instruments Incorporated, Dallas, Tex.

[22] Filed: Dec. 10, 1973

[21] Appl. No.: 423,630

[52] U.S. Cl. .................................. 357/30; 148/175; 156/17; 357/20; 357/55; 357/60
[51] Int. Cl.² ................ H01L 29/04; H01L 31/06; H01L 21/20; H01L 21/308
[58] Field of Search ........................... 357/30, 55

[56] References Cited
UNITED STATES PATENTS

| | | | |
|---|---|---|---|
| 3,150,999 | 9/1964 | Rudenberg et al. ................ | 357/55 |
| 3,171,068 | 2/1965 | Denkewalter et al. ............. | 357/55 |
| 3,278,337 | 10/1966 | Gault ................................ | 357/30 |
| 3,483,039 | 12/1969 | Gault ................................ | 357/30 |
| 3,579,057 | 5/1971 | Stoller ............................... | 357/55 |
| 3,682,708 | 8/1972 | Bennett ............................. | 357/55 |
| 3,690,953 | 9/1972 | Wise ................................. | 357/30 |
| 3,714,474 | 1/1973 | Hoff ................................. | 357/55 |
| 3,772,770 | 11/1973 | Arndt et al. ...................... | 357/55 |

OTHER PUBLICATIONS

W. P. Rahilly, "Vertical Junction Solar Cells", Conference Record, 9th IEEE Photovoltaic Specialist Conf. May 1972, pp. 44–52.

*Primary Examiner*—William D. Larkins
*Attorney, Agent, or Firm*—Harold Levine; James T. Comfort; Gary C. Honeycutt

[57] ABSTRACT

Disclosed is a method of fabricating a vertical multijunction cell and the solar cell produced thereby, utilizing an orientation dependent etch to selectively provide parallel grooves in monocrystalline silicon body, followed by the introduction of doping impurities of the opposite conductivity type from the silicon body to provide PN junctions. In some instances the grooves are filled with silicon of the same conductivity type as the silicon body.

5 Claims, 18 Drawing Figures

VERTICAL MULTIJUNCTION SOLAR CELL

BACKGROUND OF THE INVENTION

1. Field of the Invention

This invention relates to solar cells in general and specifically to vertical multijunction solar cells.

2. Description of the Prior Art

In recent years the art of fabricating silicon solar cells has evolved from the first solar cells made by forming PN junctions in silicon by diffusing boron into N type silicon that had been previously doped with phosphorus, antimony, or arsenic. However, it was found that this type of device was radiation sensitive and degraded rapidly when used in space projects due primarily to the high energy electrons of the Van Allen Belts. A significant improvement over the first cells in radiation tolerance was achieved by switching to NP cells. These cells were generally fabricated by diffusing phosphorus into P type silicon that had been previously doped with boron or one of the other Group III acceptors.

Still further radiation tolerance might be achieved by the formation of a large number of parallel vertical PN junctions, as described in U.S. Pat. No. 3,617,825 issued to George E. Chilton, et al, and assigned to Computer Dial Corporation, Fair Lawn, New Jersey, entitled "Multijunction Photodiode Detector" although radiation tolerance was not mentioned by Chilton. It has recently been recognized by J. F. Wise of Wright Patterson Air Force Base (See Air Force Contract No. F33615-72-C-1310) that Chilton's structure, if made with very close junction spacing, would be more radiation resistant than a standard flat solar cell. Theoretical calculations by W. P. Rahilly, as well as by T. B. S. Chadda and M. Wolf, also performed under Air Force Contract No. F33615-72-c-1310, suggest that the improvement in solar cell operating life in a typical space satellite mission will be 50% or even greater. The improved radiation tolerance of the vertical multijunction structure is due to the shorter average distance that a minority carrier must diffuse before being collected at the PN junction. This shorter distance that a minority carrier must travel also leads to a higher quantum efficiency, but this is a small effect compared to the enhanced radiation tolerance. The reduced carrier collection length means that for a given output power under a given level of solar illumination, the minority carrier diffusion length L can be considerably shorter than it would be in a standard solar cell. It is well known that high energy electrons reduce the minority carrier diffusion length. Thus, the vertical multijunction cell must be bombarded with significantly more damage producing high energy particles to reduce the cell efficiency by the same amount. However, the particular configuration of photodiode detector mentioned above suffers from severe degradation of minority carrier collection efficiency due to the very large number of surface intersections of the PN junctions. It is also quite difficult to fabricate in volume.

It is therefore an object of this invention to provide a method of fabricating a vertical multijunction solar cell having a minimum amount of exposed PN junction periphery.

Another object of this invention is to provide a method of fabricating a vertical multijunction solar cell having higher radiation tolerance than previously proposed vertical multijunction solar cells.

Another object of this invention is to provide a method of fabricating a vertical multijunction solar cell, which method lends itself to mass production techniques.

BRIEF DESCRIPTION OF THE DRAWINGS

The novel features believed characteristic of this invention are set forth in the appended claims. The invention, itself, however, as well as other objects and advantages thereof, may best be understood by reference to the following detailed description of the illustrative embodiments, when read in conjunction with the accompanying drawings:

DESCRIPTION OF THE PREFERRED EMBODIMENTS

Figure 1:
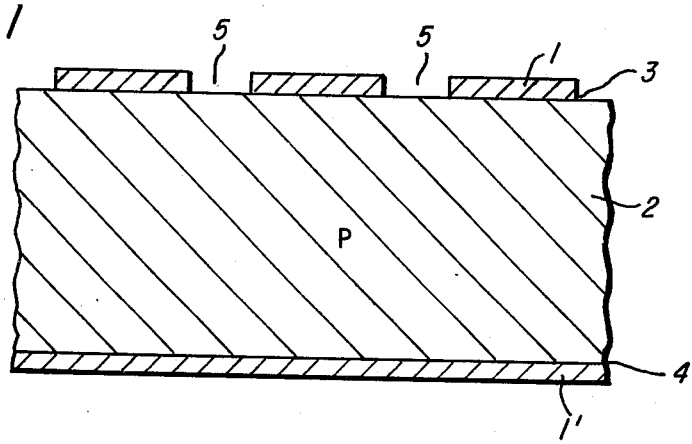
FIGS. 1–5 are cross-sectional views of a portion of a vertical multijunction solar cell following various manufacturing stages of the preferred embodiment.

Referring now to the drawings, the various structural elements are not drawn to scale for simplicity of illustration. The same structural element in the different figures illustrating the different embodiments are designated by the same numeral. In addition, although only a small number of similar type regions are illustrated, a single vertical multijunction solar cell, according to this invention, could contain hundreds or even thousands of such regions.

A patterned masking layer 1 of silicon oxide, for example, is formed on the top surface 3, while at the same time the masking layer 1' is formed on the bottom surface 4 of a P type monocrystalline silicon body 2 having a {110} crystallographic orientation, as shown in FIG. 1. The body 2 would characteristically have a resistivity of from 0.01 ohm-centimeter to 10 ohm-centimeter with 1.0 ohm-centimeter usually preferred. The crystallographic orientation of the body 2 is such that the major surfaces 3 and 4 are substantially coplanar with a {110} crystallographic plane. Prior to the application of the masking layers 1 and 1', the front and back surfaces 3 and 4, respectively, of the body 2 are mechanically or chemically polished. The backside polish is not generally used on conventional flat solar cells, but it insures a specularly reflecting back contact which increases the quantum efficiency of the cell in the near infrared region of the spectrum. The unpatterned masking layers 1 and 1' of silicon oxide are grown either thermally on the surface 3 and 4 of the body 2 or are vapor deposited thereon by conventional deposition techniques. Parallel apertures 5 to form the desired pattern are formed in the masking layer 1 by conventional photolithographic-etch techniques of about 4 microns in width, for example, as shown in FIG. 1. Apertures 5 are defined in the masking layer substantially parallel to the line defined by the intersection of the {111} plane that intersects the body 2 {110} surface at 90°. Although various dimensions will be given of the different structural elements for comparison purposes, such dimensions can be varied without departing from the scope of the invention.

Figure 2:
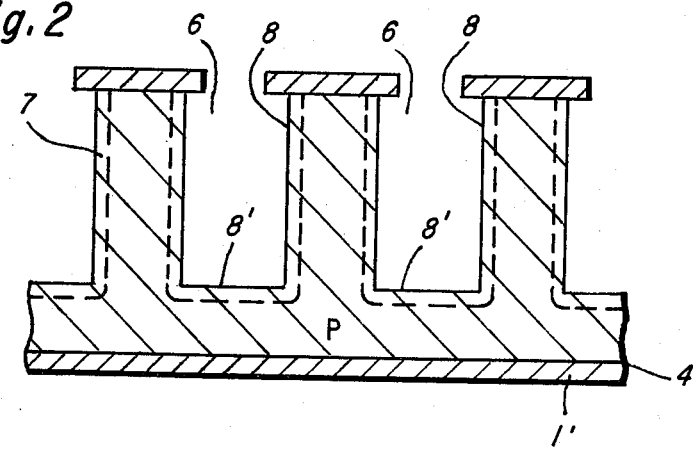

By the use of an orientation dependent etch, the parallel grooves 6 as shown in FIG. 2 are formed to a depth of 100 microns and a width of 10.5 microns, for example, with substantially parallel side walls.

The technique of etching parallel grooves in silicon is well known by the use of an orientation dependent etch solution, comprising potassium hydroxide and water, for example, which removes silicon at a well controlled rate in the range of of 0.1 to 2.0 microns per minute in the {110} plane, over the temperature range of 40° C to 80° C. The solution does not appreciably attack the silicon in the {111} plane. The apertures 5 in the masking layer 1 are in substantial alignment with the intersection of the top {110} surface of the body 2 with the perpendicular {111} planes as stated previously. For a mask oriented to this {111} intersection with a precision of better than 0.1°, for example, etch ratios, R (110/111), of over 400 have been obtained, R (110/111) being the etch ratio between the {110} and {111} planes. For a misorientation of only 1°, the R (110/111) degrades to about 35. The depths of the grooves 6 also depend to some degree on the widths of the apertures 5 provided in the masking layer 1, and upon the etching conditions. Therefore, by controlling the alignment of the apertures 5, their size and the etching conditions, the depths and widths of the grooves 6 can be well controlled.

Figure 3:
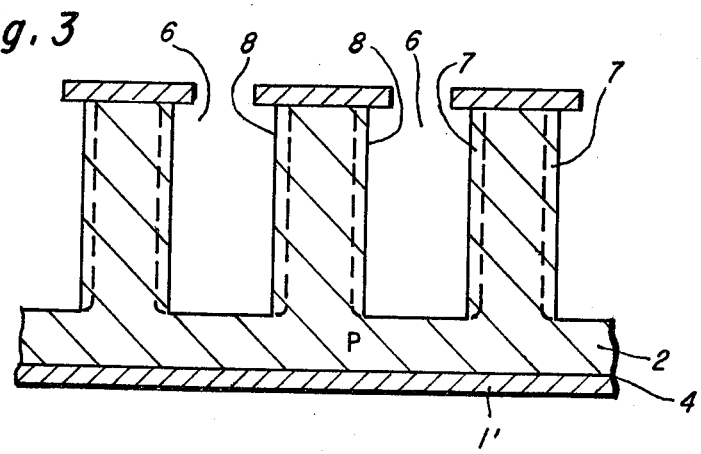

The N+ type regions 7 adjacent the sidewalls 8 and bottoms 8' are formed by introducing doping impurities of N type, such as antimony, for example, in the appropriate concentration, into the body 2 from the side walls 8 and the bottoms 8' of the grooves 6 the most appropriate method being by conventional diffusion. Following the use of a simple deglazing etch to remove the oxide formed on the sidewalls 8 and bottoms 8' during the diffusion operation, the N+ regions 7 adjacent the bottoms 8' of the apertures 6 are removed by a subsequent orientation dependent etch for a brief enough period of time to completely remove the regions 7 adjacent the bottoms 8', as shown in FIG. 3. However, the N+ regions 7 adjacent the sidewalls 8 are relatively untouched since the orientation dependent etch attacks the {110} groove bottoms 8' much faster than the slower etching {111} side walls 8. The masking layer 1 is removed by etching in a conventional etch solution that attacks silicon oxide but leaves the silicon body 1 relatively untouched.

Figure 4:
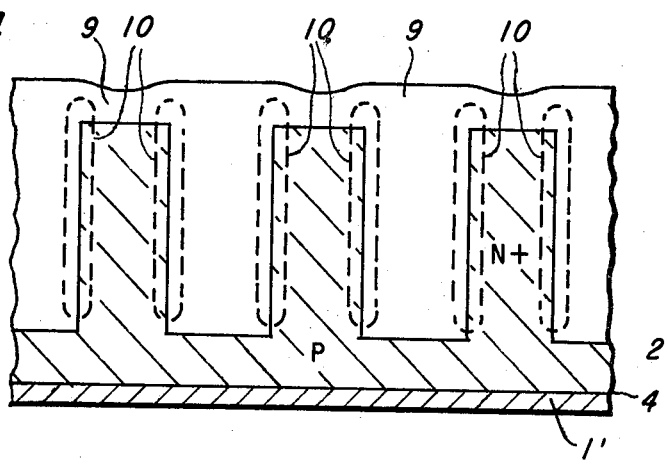

Monocrystalline P type silicon is epitaxially deposited on the side walls 7 and the new bottoms 8' until the grooves 6 are completely filled with P type silicon material 9, as shown in FIG. 4, to complete the formation of the desired number of PN junctions 10. The silicon material 9 also covers the remaining surface 3 of the body 2. The groove filling operation is done at a low enough temperature and for a short enough time so that the N diffusion does not spread too far into the P type body 2 nor into the deposited silicon material 9, such temperature being in the region of 1100° C. or lower. The substrate 20 now includes the silicon body 2 and the deposited silicon material 9.

In order to electrically connect the various N+ regions 7, an N type doping impurity is introduced into the silicon material 9 from the new surface 11 in sufficient concentration by diffusion, for example, to form the high conductivity N+region 12 adjacent the top surface 11 of the silicon material 9.

Figure 5:
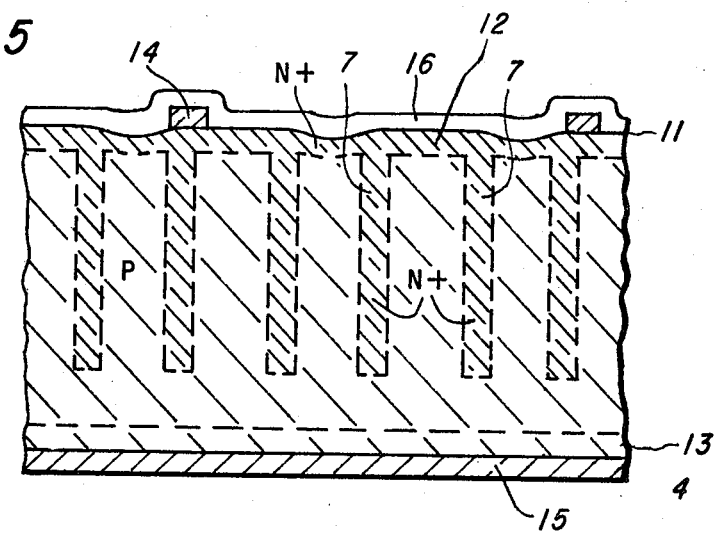
Figure 6:
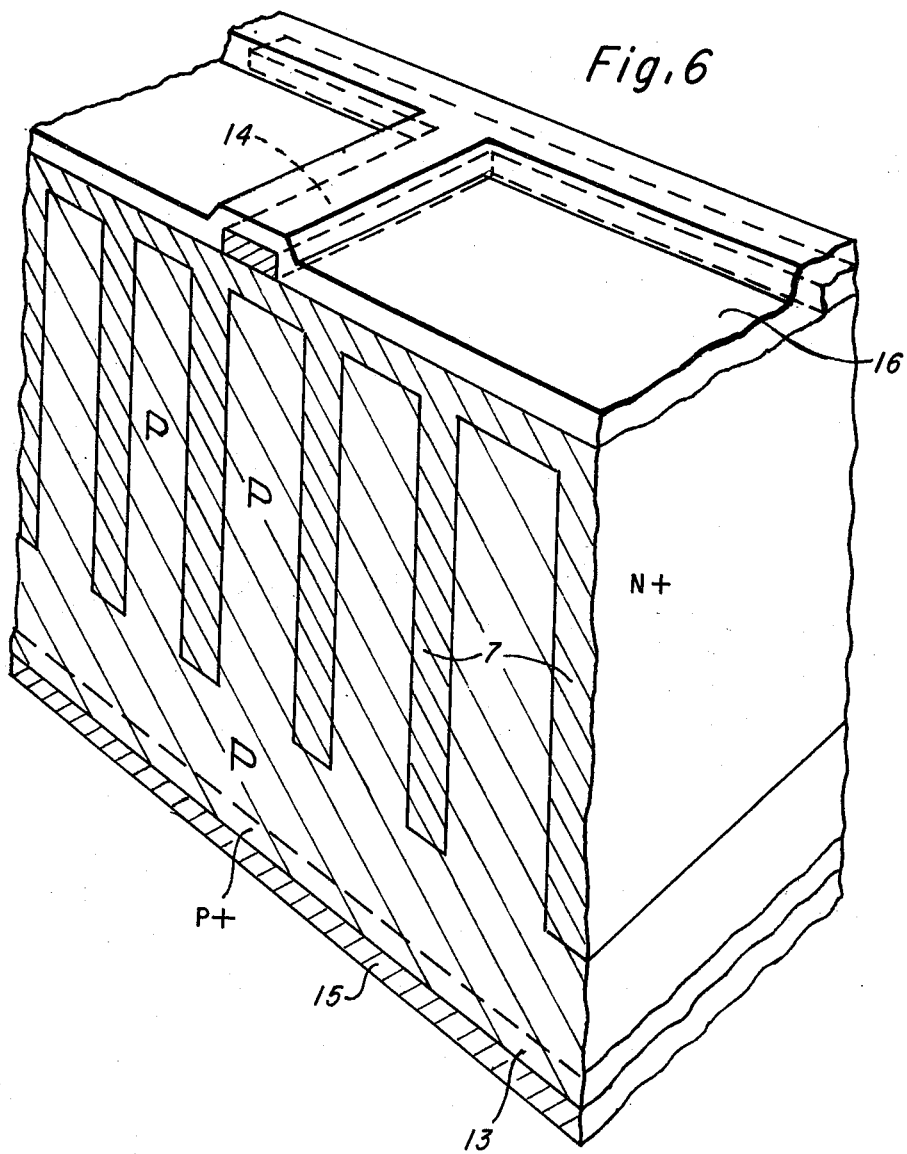
FIG. 6 is an isometric view of a portion of the preferred embodiment of a vertical multijunction solar cell, following the application of metal contacts.

The bottom masking layer 1', which is shown in FIG. 4, is removed by using the same type etch used to remove the patterned masking layer 1. A P type doping impurity, such as boron, for example, is introduced into the body 2 from the bottom surface 4 by diffusion, for example, to form the P+ conductivity type region 13 adjacent the bottom surface 4, so that the aluminum contact 15, to be subsequently applied, can make ohmic contact to the body 2, as shown in FIG. 5. Boron is chosen as the doping material because the gas flow conditions during the boron diffusion process can be readily controlled so that the doping that still remains in the N+ region 12 is not overcome. The glaze remaining after the N and P type diffusions is removed, by methods as previously explained, to allow the aluminum contacts 14 to be deposited on the N+ region 12 and the aluminum contact 15 to be deposited on the P+ region 13, as shown in FIGS. 5 and 6. The next step is the formation of the anti-reflecting coating 16, such as silicon nitride, for example, by depositing such a coating on the N+ region 12 and on the contacts 14. The body 2 would normally be a slice or a wafer of silicon, from 1 to 3 inches in diameter and such a slice might contain several vertical multijunction solar cells. The individual cells are then sawed, for example, from each other followed by a stress relief etch such as nitric-hydrofluoric-acetic acid, to relieve the sawing induced stresses.

Although the fabrication steps described in conjunction with FIGS. 1–5 are the simplest to achieve the structure as shown in FIGS. 5 and 6, the epitaxially deposited regions 9, as shown in FIG. 4, can be chemically etched or mechanically lapped off and polished down to the P type material 9 in the filled grooves 6. The N+ region 12 is thus subsequently formed, as was described in conjunction with FIG. 5, on a polished flat surface (not shown), in order to tie together the vertical PN junctions between the N+ regions 7 and the P type silicon body 2. The N+ diffusion may be preceded by a thin N type epitaxial deposition in order to tailor the N type concentration profile to achieve a particular type of spectral response.

Another modification of the structure as shown in FIG. 5 (not shown) is to remove the bottom of the P type body 2 from the structure 4 until the N+ regions 7, as shown in FIG. 5, are reached. A P type epitaxial deposition followed by a boron diffusion is then applied to improve the surface recombination velocity on this surface.

Figure 7:
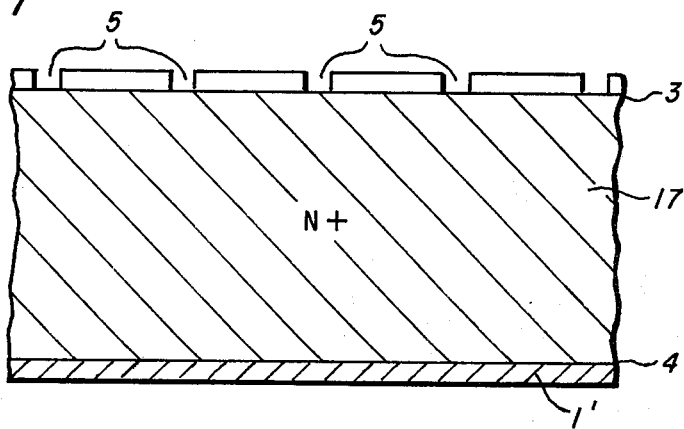
FIGS. 7–10 are cross-sectional views of a portion of a vertical multijunction solar cell, following various manufacturing stages of one alternate embodiment.
Figure 8:
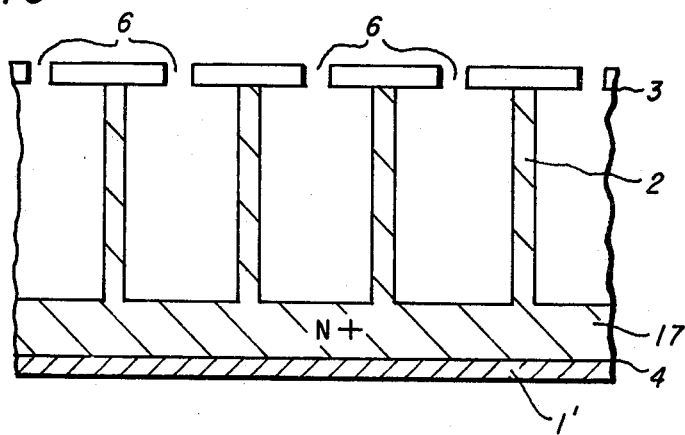
Figure 9:
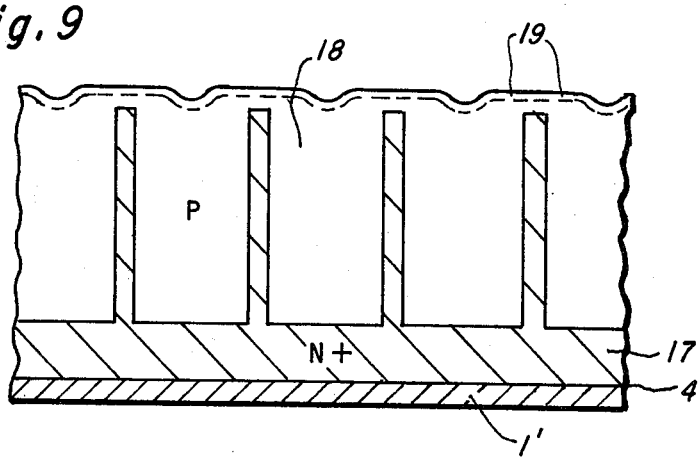
Figure 10:
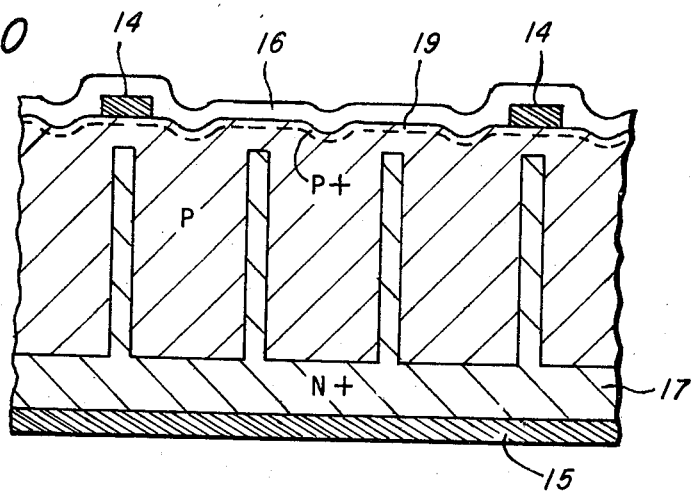

The result of the first fabricating steps of one alternate embodiment of the invention is shown in FIG. 7, which utilizes an N+ type monocrystalline silicon body 17. A patterned masking layer 1 is formed on the surface 3 and a masking layer 1' is formed on the surface 4 of the body 17. The masking layers 1 and 1' are of silicon oxide, for example, and the patterned apertures 5 are conventionally formed by the techniques and methods as described in conjunction with FIG. 1. Also, as described in conjunction with FIG. 2, the widths of the apertures 5, in this example being 3 microns, determine the widths, for example 9 microns, of the orientation dependent etched grooves 6 as shown in FIG. 8. The widths of the grooves 6 are much greater than the adjoining body 2 between grooves 6. The body 17 is subjected to a conventional orientation dependent etch for a period of time sufficient to etch out the grooves 6 to depths, for example, of 100 microns. The grooves 6 are then filled with monocrystalline P type silicon material 18 by epitaxial deposition methods, as shown in FIG. 9. The substrate 30 now includes the silicon body 17 and the deposited silicon material 18.

The P+ type region 19 is formed by introducing a P type doping impurity, such as boron, by diffusion, for example, into the silicon material 18, as shown in FIG. 9. The glaze resulting from the boron diffusion and the masking layer 1' are removed by conventional etching methods. Patterned metal contacts 14 and the continuous rear contact 15 are formed of aluminum on the P+ type region 19, and surface 4 of body 17, by conventional aluminum deposition and photolithographic etch techniques. The anti-reflecting coating 16 and the separation of the individual cells is accomplished as previously described.

Figure 11:
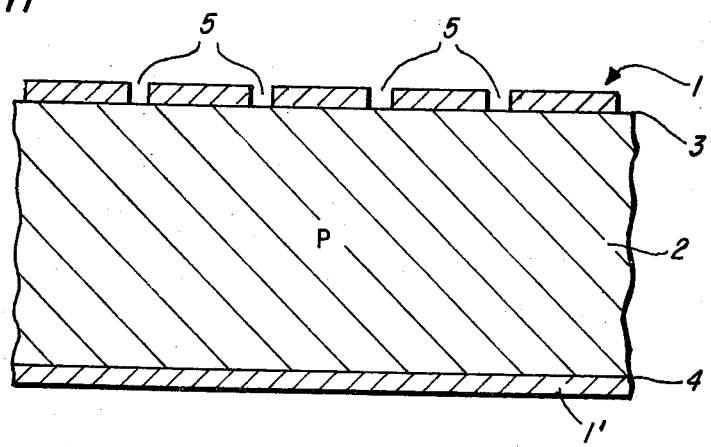
FIGS. 11–14 are cross-sectional views of a portion of a vertical multijunction solar cell following various manufacturing stages of a second alternate embodiment.
Figure 12:
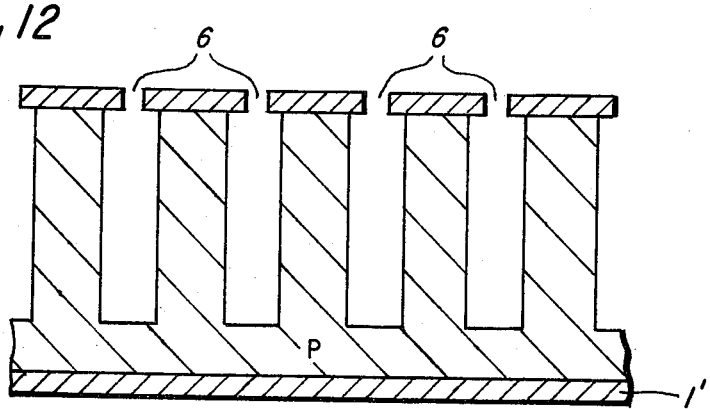

The result of the first fabrication steps of the second alternate embodiment is shown in FIG. 11 after the patterned masking layer 1 and 1' have been formed on surface 1 of the P type monocrystalline silicon body 2. The formation of the patterned apertures 5 in the masking layer 1, is accomplished as described previously. In this embodiment, because very narrow grooves 6 are required, as shown in FIG. 12, having a width of 1.0 micrometers, for example, the width of the apertures 5 must be approximately 0.5 micrometers, for example. In order to form the narrow grooves 6 having depths of 100 microns, for example, an orientation dependent etch with a very high value of R (110/111) is required, in the range of 400, for example. The silicon body 2 is subjected to such an orientation dependent etch for a period of time sufficient to reach the desired depth.

The masking layer 1 is removed, as previously explained, while the masking layer 1' is left on the body 2 in order to prevent diffusing N type impurities into the body 2 from the surface 4. The N+ type region 18 is formed by introducing, by diffusion, for example, an N doping impurity such as phosphorus, for example, into the P type silicon body 2 into the side walls 8 and bottoms 8' of the grooves 6 and into the remaining surface 3 to form region 18 adjacent the sidewalls 8, bottoms 8' and surface 3. Contrary to the previously described procedures where the grooves 6 were filled with epitaxially deposited monocrystalline silicon material, the grooves 6 are not filled in this embodiment leaving parallel portions of body 2 therebetween. Although this approach appears to immediately result in 10 to 20 percent loss in efficiency due to the loss of 10 to 20 percent of the material from the grooves, this is not the case since the light that impinges on the cell inside the grooves can still enter the structure and generate hole-electron pairs. In addition, the remaining surface 3, after the grooves are formed, which now is the top surface of the column 2', although shown as being relatively flat, can be formed into spikes or inverted "V" shaped (not shown) having sides with slopes of less than 45° with respect to the vertical. Very sharply pointed regions can be formed in a mixture of hydrofluoric, nitric, and acetic in the respective ratios of 1-30-80 for example. Due to such a slope, little impinging light is allowed to escape the grooves by reflection and the great majority is thereby absorbed.

Figure 13:
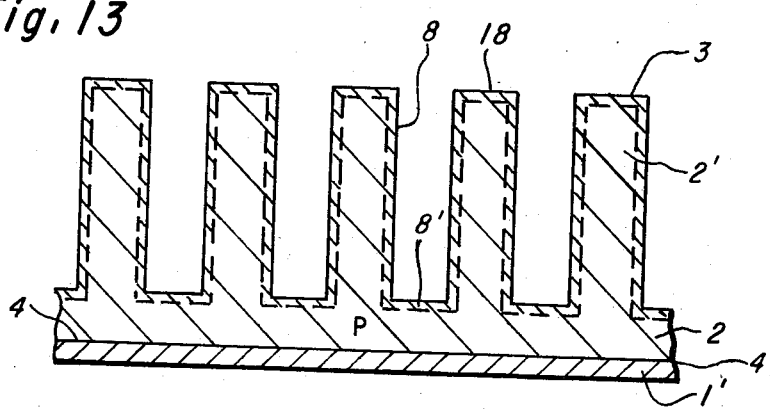
Figure 14:
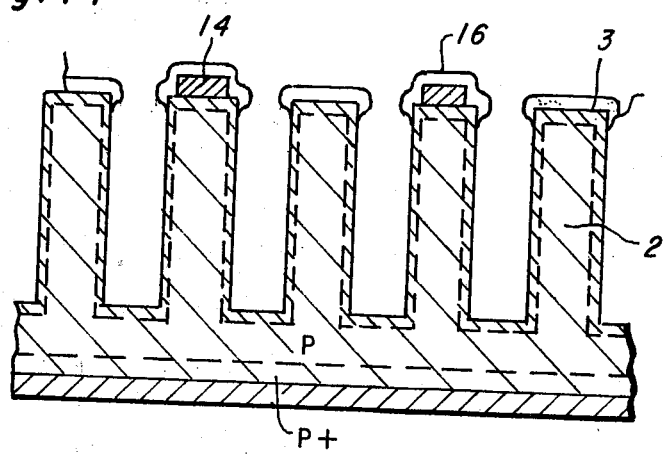

The glaze remaining after the N type diffusion forming the N+ type region 18 and the masking layer 1' as shown in FIG. 13, are removed as noted previously.

The aluminum contacts 14 and 15 are deposited on the remaining surfaces 3 and 4, respectively, of the body 2. However, due to the grooves 6, the aluminum contacts 14 are deposited through a "shadow mask" for the photolithographic-etch techniques as described in conjunction with the previous embodiments are more difficult in the presence of the open grooves. The "shadow mask" technique of depositing aluminum through a patterned mask spaced from the remaining surfaces 3 of the body 2 is not critical since very little area loss will occur even if metal is deposited on the side walls 8. As before, the anti-reflecting layer 16, of silicon oxide, for example, is deposited on the aluminum contacts 14 and the remaining surface 3 of the body 2, and the individual cells are separated.

Figure 15:
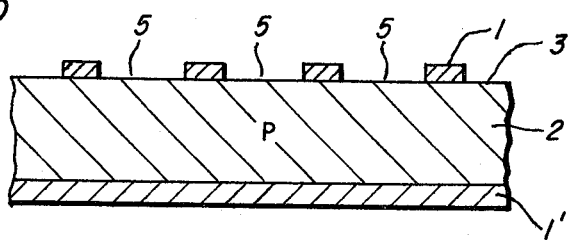
FIGS. 15–18 are cross-sectional views of a portion of a vertical multijunction solar cell following various manufacturing stages of a third alternate embodiment.
Figure 16:
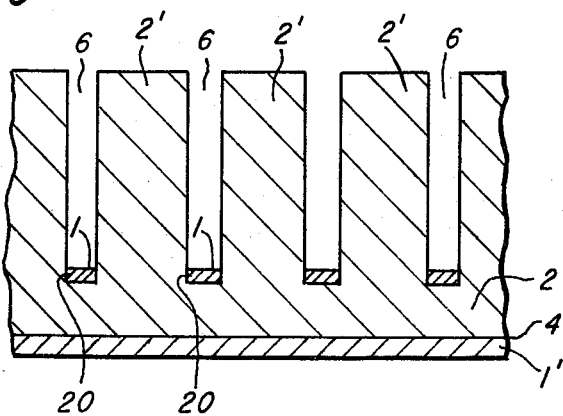
Figure 17:
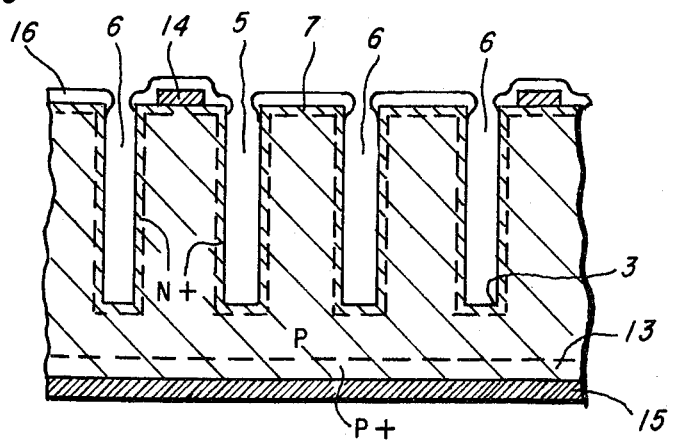

The third alternate embodiment of the invention is described sequentially in conjunction with FIGS. 15–17. The patterned masking layer 1 and the masking layer 1' are formed as has been previously described, with apertures 5, having widths of 9.5 microns, for example, as shown in FIG. 15. However, in contrast to the previous embodiments, the apertures 5 in the masking layer 1 are not used to etch grooves in the P type monocrystalline silicon body 2 but are used to deposit therein epitaxial material to form the columns 2' by the use of epitaxial orientation dependent deposition techniques, as shown in FIG. 16. The epitaxial deposition columns 2' would typically be deposited to a height of 100 microns. The remaining masking layer 1, as shown in FIG. 16, is removed from the original surface 3 of what is now called grooves 6.

The N+ region 7, as shown in FIG. 17, is formed by introducing an N type doping impurity, such as phosphorus by diffusion, for example, into the side walls 8 of the grooves 6 (being also the sidewalls of the columns 2', of course) and into the body 2 by the original surfaces 3. As before, the masking layer 1' prevents diffusion of impurities into the bottom surface 4 of the body 2. The masking layer 1', as shown in FIG. 16, is removed by etching and the P+ type region 13 adjacent the surface 4 is formed by introducing P type doping impurities, such as boron, into the body 2 from surface 4, by diffusion, for example. The glaze formed by the diffusion of regions 7 and 13 is then removed by etching. The aluminum contacts 14 and 15 are formed, as previously described, followed by the formation of the anti-reflection coating 16 and individual cell separation as has also been described.

Figure 18:
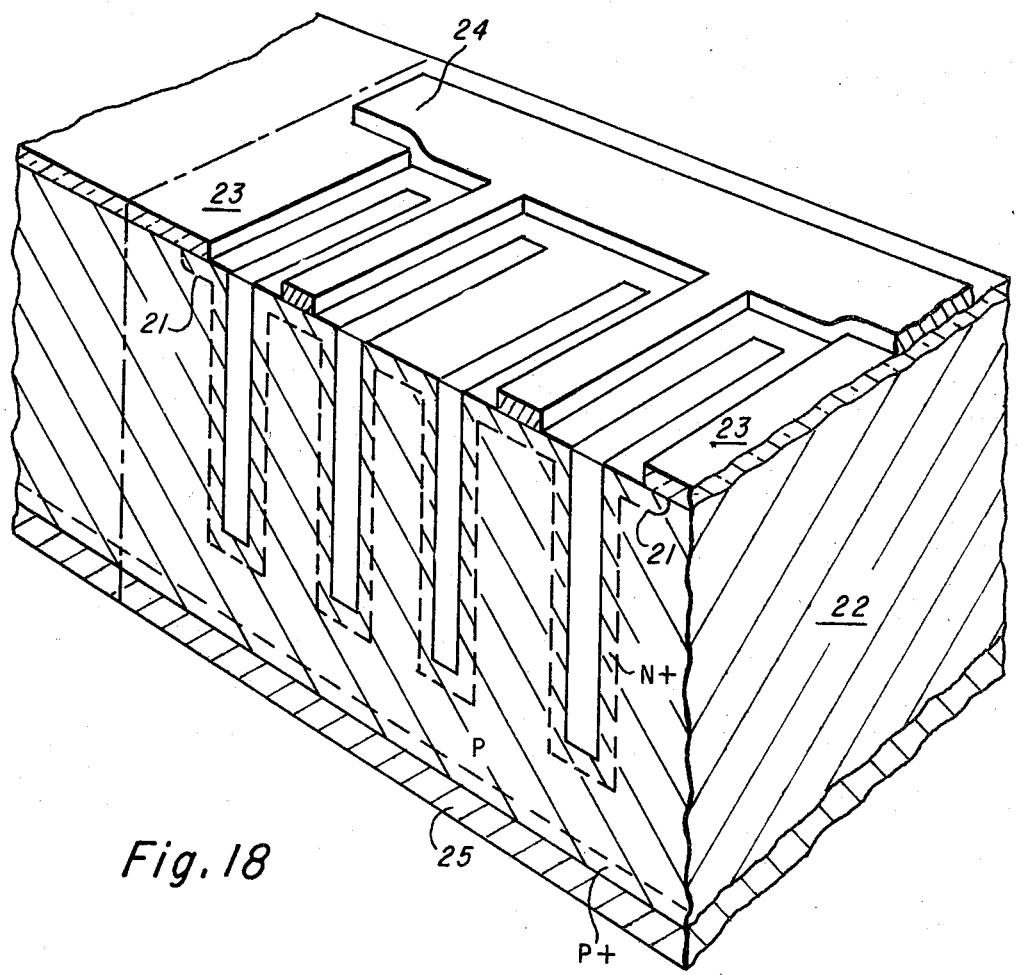

FIG. 18 is a perspective view, partly in cross-section, showing an example of suitable passivation-layer geometry for an embodiment of the invention such as that of FIG. 17. Specifically, PN+ junction 21 terminates at the surface of silicon body 22, and is passivated at the surface by silicon oxide layer 23. Metallization layers 24 and 25 are patterned as before, and may be covered with a suitable antireflection coating (not shown) as in FIG. 17.

Although diffusion has been described as one method of introducing doping impurities into the body 2, ion implantation, for example, can be used in most instances. As described in copending application entitled "Composite Semiconductor Structures" Ser. No. 276,808, this allows a given dopant to be introduced into a particular sidewall 8 of the grooves 6, which would be useful in certain applications where the cone angle and direction of the photo sensitivity needed to be restricted.

Although the preferred embodiment of the invention, along with three alternate embodiments, have been described in rather specific details, it is to be understood that various changes, substitutions and alterations can be made therein without departing from the spirit and the scope of the invention as defined by the appended claims.

What is claimed is:

1. A semiconductor device in a monocrystalline semiconductor body of one conductivity type;
   a. a plurality of spaced parallel semiconductor columns of one conductivity type, each having a thickness about 10 microns, extending out from said body; and separated by grooves having a depth of about 100 microns;
   b. a continuous semiconductor region of opposite conductivity type in said columns, adjacent the surfaces thereof and in said body between said columns to form a continuous PN junction; and
   c. a pattern of metal contacts on the top surface of said columns and on the opposite surface of said body.

2. The device as defined in claim 1, including a high conductivity semiconductor region of said one conductivity type in said substrate adjacent the opposite surface thereof.

3. The device defined in claim 1, wherein said body and said column are silicon.

4. The device as defined in claim 3, wherein the top surfaces of said columns are sharply pointed to minimize reflection.

5. The device of claim 1 wherein said PN junction is passivated at the surface of the semiconductor.

* * * * *